United States Patent
Fung et al.

(10) Patent No.: US 12,283,484 B2
(45) Date of Patent: Apr. 22, 2025

(54) SELECTIVE DEPOSITION OF CARBON ON PHOTORESIST LAYER FOR LITHOGRAPHY APPLICATIONS

(71) Applicant: Applied Materials, Inc., Santa Clara, CA (US)

(72) Inventors: Nancy Fung, Livermore, CA (US); Larry Gao, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 508 days.

(21) Appl. No.: 17/342,644

(22) Filed: Jun. 9, 2021

(65) Prior Publication Data
US 2022/0005688 A1 Jan. 6, 2022

Related U.S. Application Data (60) Provisional application No. 63/047,719, filed on Jul. 2, 2020.

(51) Int. Cl.
*H01L 21/027* (2006.01)
*C23C 14/04* (2006.01)
(Continued)

(52) U.S. Cl.
CPC ........ *H01L 21/0276* (2013.01); *C23C 14/042* (2013.01); *C23C 14/0605* (2013.01);
(Continued)

(58) Field of Classification Search
CPC ............ H01L 21/0276; H01L 21/0332; H01L 21/0335; H01L 21/0337; H01L 21/0338;
(Continued)

(56) References Cited

U.S. PATENT DOCUMENTS 7,078,351 B2    7/2006    Chiu et al.
7,354,847 B2    4/2008    Chan et al.
(Continued)

FOREIGN PATENT DOCUMENTS

KR    20060011430 A    2/2006
KR    20170066225 A    6/2017
(Continued)

OTHER PUBLICATIONS

International Search Report / Written Opinion issued to PCT/US2021/036547 on Sep. 29, 2021.
(Continued)

*Primary Examiner* — Bitew A Dinke
(74) *Attorney, Agent, or Firm* — Patterson + Sheridan, LLP (57) ABSTRACT

Embodiments disclosed within include a method for etching a hardmask layer includes forming a photoresist layer comprising an organometallic material on a hardmask layer comprising a metal-containing material, exposing the photoresist layer to ultraviolet radiation through a mask having a selected pattern, removing un-irradiated areas of the photoresist layer to pattern the photoresist layer, forming a passivation layer comprising a carbon-containing material selectively on a top surface of the patterned photoresist layer, including selectively depositing passivation material over a top surface of a patterned photoresist layer trimming undesired portions of the passivation material, and etching the hardmask layer exposed by the patterned photoresist layer having the passivation layer formed thereon.

25 Claims, 4 Drawing Sheets

(51) Int. Cl.

| | | |
|---|---|---|
| *C23C 14/06* | (2006.01) | |
| *C23C 14/58* | (2006.01) | |
| *C23C 16/56* | (2006.01) | |
| *G03F 7/11* | (2006.01) | |
| *G03F 7/20* | (2006.01) | |
| *G03F 7/26* | (2006.01) | |
| *H01L 21/033* | (2006.01) | |
| *G03F 7/004* | (2006.01) | |

(52) U.S. Cl.
CPC .......... *C23C 14/5873* (2013.01); *C23C 16/56* (2013.01); *G03F 7/11* (2013.01); *G03F 7/2002* (2013.01); *G03F 7/26* (2013.01); *H01L 21/0332* (2013.01); *H01L 21/0335* (2013.01); *H01L 21/0337* (2013.01); *H01L 21/0338* (2013.01); *G03F 7/0042* (2013.01)

(58) Field of Classification Search
CPC .......... H01L 21/02115; H01L 21/02274; H01L 21/0273; H01L 21/31116; H01L 21/31138; H01L 21/31144; H01L 21/67103; H01L 21/67109; H01L 21/67248; H01L 21/6831; C23C 16/042; C23C 16/26; C23C 16/56; G03F 7/16; G03F 7/2002; G03F 7/26; G03F 7/0042; G03F 7/094; G03F 7/40
See application file for complete search history.

(56) References Cited

U.S. PATENT DOCUMENTS

| | | | | |
|---|---|---|---|---|
| 7,473,377 | B2* | 1/2009 | Yamaguchi | H01L 21/312 257/E21.252 |
| 9,006,106 | B2 | 4/2015 | Kao et al. | |
| 11,495,461 | B2* | 11/2022 | Singh | H01L 21/0332 |
| 11,776,811 | B2* | 10/2023 | Gao | H01L 21/0332 438/703 |
| 2004/0072430 | A1* | 4/2004 | Huang | H01L 21/76808 257/E21.252 |
| 2006/0024971 | A1* | 2/2006 | Park | H01L 21/31144 257/E21.232 |
| 2006/0105574 | A1* | 5/2006 | Regini | H01L 21/31144 257/E21.252 |
| 2007/0026677 | A1* | 2/2007 | Ji | H01L 21/0337 438/689 |
| 2009/0191711 | A1* | 7/2009 | Rui | G03F 7/40 156/345.24 |
| 2010/0009542 | A1* | 1/2010 | Honda | H01L 21/31138 257/E21.241 |
| 2010/0099046 | A1* | 4/2010 | Kim | H01L 21/0337 430/319 |
| 2012/0094495 | A1* | 4/2012 | Honda | H01L 21/0337 438/696 |
| 2013/0020026 | A1* | 1/2013 | Sheu | H01L 21/31144 156/345.24 |
| 2017/0092495 | A1* | 3/2017 | Chen | G03F 7/091 |
| 2017/0263443 | A1* | 9/2017 | Matsumoto | G03F 7/2004 |
| 2017/0271150 | A1* | 9/2017 | Chang | G03F 7/11 |
| 2018/0025914 | A1* | 1/2018 | Zhou | H01L 21/32135 438/695 |
| 2018/0031975 | A1* | 2/2018 | Sung | G03F 7/325 |
| 2018/0239244 | A1* | 8/2018 | Raley | H01L 21/0337 |
| 2018/0240667 | A1* | 8/2018 | Yu | H01L 21/67069 |
| 2019/0094685 | A1 | 3/2019 | Marks et al. | |
| 2019/0157106 | A1* | 5/2019 | Joseph | H01L 21/32136 |
| 2019/0198391 | A1 | 6/2019 | Krishtab et al. | |
| 2019/0311902 | A1* | 10/2019 | Shin | H01L 21/0332 |
| 2020/0075319 | A1 | 3/2020 | Chang et al. | |
| 2020/0234970 | A1* | 7/2020 | Hoshi | H01L 21/31116 |
| 2021/0041784 | A1* | 2/2021 | Chen | G03F 7/322 |
| 2021/0082697 | A1* | 3/2021 | De Silva | H01L 21/0337 |
| 2021/0109442 | A1* | 4/2021 | Moon | H01L 21/0274 |
| 2021/0217614 | A1* | 7/2021 | Lutker-Lee | H01L 21/0337 |
| 2021/0336046 | A1* | 10/2021 | Wang | H01L 29/41791 |
| 2021/0364922 | A1* | 11/2021 | Chen | H01L 21/0274 |
| 2021/0389670 | A1* | 12/2021 | Chen | C09D 201/02 |
| 2021/0391181 | A1* | 12/2021 | Chang | H01L 21/31144 |

FOREIGN PATENT DOCUMENTS

| | | |
|---|---|---|
| KR | 20190142426 A | 12/2019 |
| TW | 201801142 A | 1/2018 |
| TW | 201842573 A | 12/2018 |
| WO | 2020102085 A1 | 5/2020 |
| WO | 2020132281 A1 | 6/2020 |

OTHER PUBLICATIONS

Office Action for Taiwan Application No. 110123706 dated May 19, 2023.
Search Report for Taiwan Application No. 110123706 dated May 15, 2023.
Michael Quirk, et al., Semiconductor Manufacturing Technology, Prentice Hall 2001, 2 pages.
Office Action issued to Korean Application No. 10-2021-0085846 on Jan. 6, 2025 in 8 pages.

* cited by examiner

SELECTIVE DEPOSITION OF CARBON ON PHOTORESIST LAYER FOR LITHOGRAPHY APPLICATIONS

CROSS-REFERENCE TO RELATED APPLICATIONS

This application claims the benefit of U.S. Provisional Patent Application Ser. No. 63/047,719, filed on Jul. 2, 2020, the entirety of which is herein incorporated by reference.

BACKGROUND

Field

The embodiments herein generally relate to a method and, more specifically, to a method of selective deposition of carbon on a photoresist layer.

Description of the Related Art

Reliably producing submicron and smaller features is one of the key requirements of very large scale integration (VLSI) and ultra large scale integration (ULSI) of semiconductor devices. However, with the continued miniaturization of circuit technology, the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As feature sizes have become smaller, the demand for higher aspect ratios, defined as the ratio between the depth of the feature to the width of the feature, has steadily increased to 1:5 and greater. Developing film stacks and etch processes that are capable of reliably forming features with such high aspect ratios presents a significant challenge. However, inaccurate control or low resolution of the lithography exposure and developing process may cause inaccurate dimension of a photoresist layer utilized to transfer features in a film stack, resulting in unacceptable line width roughness (LWR). LWR and undesired wiggling profile of the photoresist layer resulting from the lithography exposure and developing process may cause inaccurate feature transfer to the film stack, eventually leading to device failure and yield loss.

Furthermore, during etching of a film stack, redeposition or build-up of by-products or other materials generated during the etching process can accumulate on the top and/or sidewalls of the features being etched, thus undesirably blocking the opening of the feature being formed in the material layer. Different materials selected for the film stack can result in different amounts or profiles of the by-products redeposited in the film stack. Furthermore, as the opening of the etched features are narrowed and/or sealed by the accumulated redeposition of material, the reactive etchants are prevented from reaching the lower surface of the features, thus limiting the aspect ratio that may be obtained. Additionally, as the redeposition material or build-up of by-products randomly and/or irregularly adhere to the top surface and/or sidewalls of the features being etched, the resulting irregular profile and growth of the redeposition material can alter the flow path of the reactive etchants, thus resulting in bowing or twisting profiles of the features formed in the material layer. Inaccurate profile or structural dimensions can result in collapse of the device structure, eventually leading to device failure and low product yield. Poor etching selectivity to the materials included in the film stack can undesirably result in an inaccurate profile control, thus eventually leading to device failure.

Therefore, there is a need in the art for a proper film stack and an etching method for etching features with desired profile and small dimensions in such film stack.

SUMMARY

Methods for forming a film stack and etching the same to form high aspect ratio features in the film stack are provided. The methods described herein facilitate profile and dimension control of features with high aspect ratios through a proper sidewall and bottom management scheme with desired materials selected for the film stack.

In one embodiment, a method for etching a hardmask layer is provided. The method includes forming a photoresist layer including an organometallic material on the hardmask layer including a metal-containing material, exposing the photoresist layer to ultraviolet radiation through a mask having a selected pattern, removing un-irradiated areas of the photoresist layer to form a patterned photoresist layer, forming a passivation layer including a carbon-containing material selectively on a top surface of the patterned photoresist layer, and etching the hardmask layer exposed by the patterned photoresist layer having the passivation layer formed thereon.

In another embodiment, a method for etching a film stack is provided. The method includes forming a hardmask layer, forming a photoresist layer including an organometallic material on the hardmask layer, exposing the photoresist layer to ultraviolet radiation through a mask having a selected pattern, removing un-irradiated areas of the photoresist layer to form a patterned photoresist layer, forming a passivation layer including a carbon-containing material selectively on a top surface of the patterned photoresist layer, etching the hardmask layer exposed by the patterned photoresist layer having the passivation layer formed thereon to form a patterned hardmask layer, and etching the film stack exposed by the patterned hardmask layer.

In yet another embodiment, a method for forming a passivation layer is provided. The method includes selectively depositing passivation material over a top surface of a patterned photoresist layer and trimming undesired portions of the passivation material. The passivation layer includes a carbon-containing material.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

To facilitate understanding of the embodiments, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary examples and are therefore not to be considered limiting of its scope, for the invention may admit to other equally effective embodiments.

DETAILED DESCRIPTION

Methods for forming a film stack and etching the same to form high aspect ratio features in the film stack are provided. The methods described herein facilitate profile and dimension control of features with high aspect ratios through a proper sidewall and bottom management scheme with desired materials selected for the film stack. In particular, the methods described herein provide a metal-containing photoresist layer having a carbon-containing passivation layer selectively disposed thereon that has a high etch selectivity from an underlying metal-containing hardmask layer, leading to higher accuracy control of profile of openings etched in the hardmask layer. In addition, methods disclosed herein include methods of forming a passivation layer, including selectively depositing passivation material over a top surface of a patterned photoresist layer and trimming undesired portions of the passivation material.

As used herein, the term "about" refers to a +/-10% variation from the nominal value. It is to be understood that such a variation can be included in any value provided herein.

Figure 1:
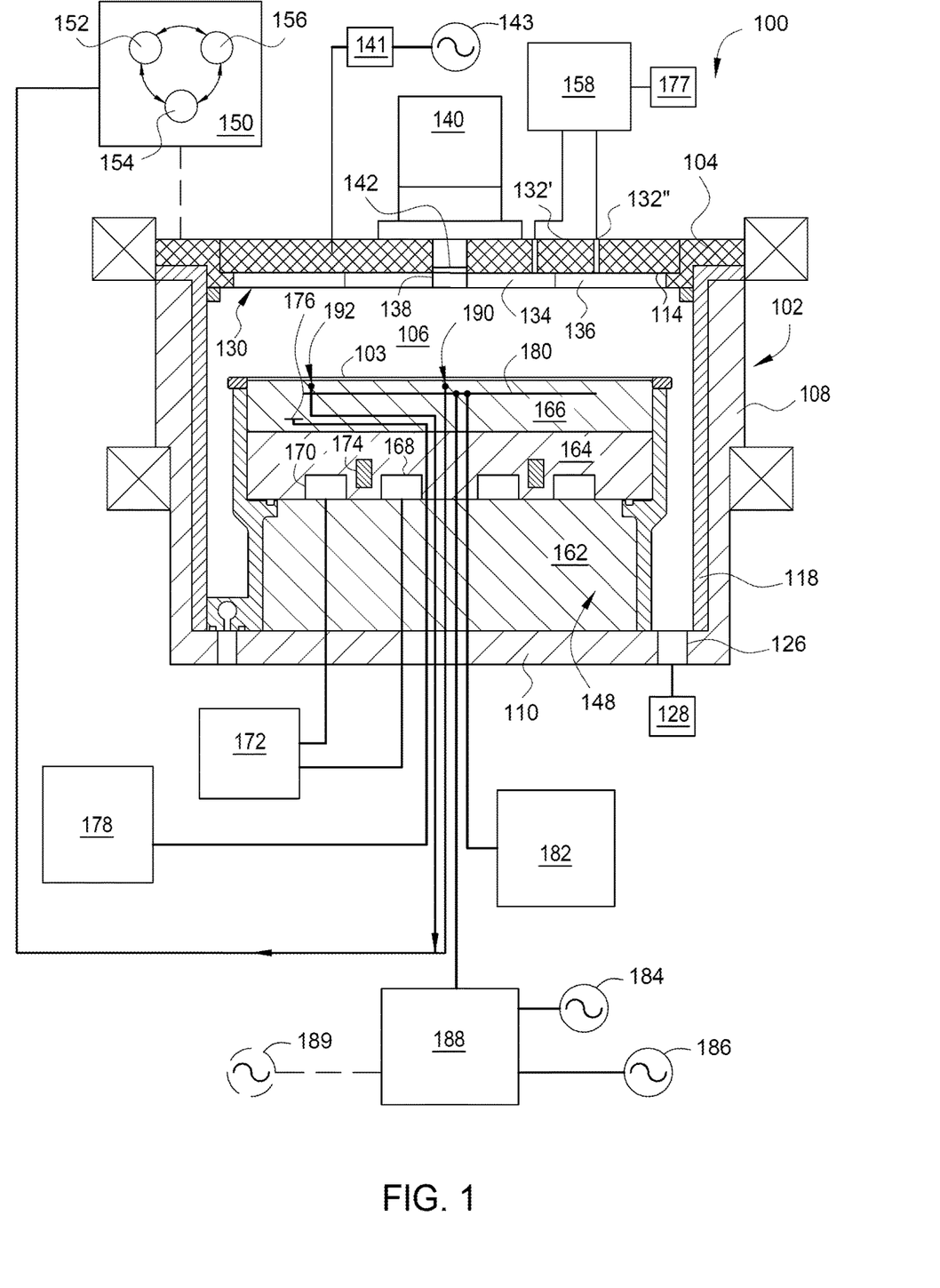
FIG. 1 illustrates a cross-sectional view of a processing chamber, according to one embodiment.

FIG. 1 illustrates a cross-sectional view of a processing chamber 100, according to one embodiment. In one example, the processing chamber 100 is suitable for performing a patterning process to etch a film stack having a hardmask layer fabricated from a metal-containing material. Suitable processing chambers that can be adapted for use with the teachings disclosed herein include, for example, an ENABLER® or SYM3® processing chamber available from Applied Materials, Inc. of Santa Clara, California. Although the processing chamber 100 is shown including a plurality of features that enable superior etching performance, it is contemplated that other processing chambers can be adapted to benefit from one or more of the inventive features disclosed herein.

As shown, the processing chamber 100 includes a chamber body 102 and a lid 104 which enclose an interior volume 106. The chamber body 102 is fabricated from aluminum, stainless steel or any other suitable material. The chamber body 102 includes sidewalls 108 and a bottom 110. A substrate support pedestal access port (not shown) is generally defined in a sidewall 108 and is selectively sealed by a slit valve (not shown) to facilitate entry and egress of a substrate 103 from the processing chamber 100. An exhaust port 126 is defined in the chamber body 102. The exhaust port 126 couples the interior volume 106 to a pump system 128. The pump system 128 includes one or more pumps and throttle valves utilized to evacuate and regulate the pressure of the interior volume 106 of the processing chamber 100. The pump system 128 maintains the pressure inside the interior volume 106 at operating pressures between about 10 mTorr to about 500 Torr.

The lid 104 is sealingly supported on the sidewall 108 of the chamber body 102. The lid 104 is configured to open to allow excess to the interior volume 106 of the processing chamber 100. The lid 104 includes a window 142 that facilitates optical process monitoring. The window 142 includes quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or a substrate 103 positioned on a substrate support pedestal assembly 148 through the window 142. The optical monitoring system 140 is coupled to the lid 104 and facilitates an integrated deposition process that uses optical metrology to provide information that enables process adjustment to compensate for incoming substrate pattern feature inconsistencies (e.g. thickness), provide process state monitoring (e.g., plasma monitoring, temperature monitoring) as needed. One optical monitoring system that can be adapted to benefit from the invention is the EyeD® full-spectrum, interferometric metrology module, available from Applied Materials, Inc., of Santa Clara, California.

A gas panel 158 is coupled to the processing chamber 100 to provide process and/or cleaning gases to the interior volume 106. Inlet ports 132', 132" are provided in the lid 104 to allow gases to be delivered from the gas panel 158 to the interior volume 106 of the processing chamber 100.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106. The plurality of apertures allow gas flow in a predefined distribution across the surface of the substrate 103 being processed in the processing chamber 100.

A remote plasma source 177 is coupled to the gas panel 158 to facilitate dissociating gas mixture from a remote plasma prior to entering into the interior volume 106 for processing. A radio frequency (RF) power source 143 is coupled through a matching network 141 to the showerhead assembly 130. The RF power source 143 is configured to create up to about 3,000 W of power at a tunable frequency in a range from about 50 kHz to about 200 MHz.

The showerhead assembly 130 additionally includes an optically transmissive region (alternatively referred to as an optically transmissive passage) 138. The optically transmissive region 138 is transmissive to an optical metrology signal. The optically transmissive region 138 is suitable for allowing the optical monitoring system 140 to view the interior volume 106 and/or the substrate 103 positioned on the substrate support pedestal assembly 148. The optically transmissive region 138 can be an aperture or plurality of apertures formed or disposed in the showerhead assembly 130. The optically transmissive region 138 is substantially transmissive to the wavelengths of energy generated by, and reflected back to, the optical monitoring system 140. The optically transmissive region 138 includes the window 142 to prevent gas leakage through the optically transmissive region 138. The window 142 can be a sapphire plate, quartz plate or other suitable material. In one embodiment, the window 142 is alternatively disposed in the lid 104 directly below the optical monitoring system 140.

The showerhead assembly 130 is configured with a plurality of zones that allow for separate control of gas flowing into the interior volume 106 of the processing chamber 100. The showerhead assembly 130 has an inner zone 134 and an outer zone 136, each of which are separately coupled to the gas panel 158 through separate inlet ports 132', 132".

The substrate support pedestal assembly 148 is disposed in the interior volume 106 of the processing chamber 100 below the showerhead assembly 130. The substrate support pedestal assembly 148 supports the substrate 103 during processing. The substrate support pedestal assembly 148 can include a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 circumscribes the periphery of the substrate support pedestal assembly 148.

As shown, the substrate support pedestal assembly 148 includes a mounting plate 162, a base 164, and an electrostatic chuck (ESC) 166. The mounting plate 162 is coupled to the bottom 110 of the chamber body 102. The mounting plate 162 includes passages for routing utilities, such as fluids, power lines and sensor leads, among others, to the base 164 and the electrostatic chuck 166. The electrostatic chuck 166 includes at least one clamping electrode 180 for retaining the substrate 103 below showerhead assembly 130. The electrostatic chuck 166 is driven by a chucking power source 182 to develop an electrostatic force that holds the substrate 103 to the chuck surface. In one embodiment, the substrate 103 is retained to the substrate support pedestal assembly 148 by clamping, vacuum, or gravity, in combination with the electrostatic force developed by the electrostatic chuck 166. In another embodiment, the substrate 103 is retained to the substrate support pedestal assembly 148 by clamping, vacuum, or gravity, and an electrostatic chuck is not included.

At least one of the base 164 or the electrostatic chuck 166 include at least one embedded heater 176, at least one embedded isolator 174, and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 are monitored using a plurality of temperature sensors 190, 192. In one embodiment, the electrostatic chuck 166 further includes a plurality of gas passages (not shown), such as grooves, that are formed in a substrate support pedestal supporting surface of the electrostatic chuck 166 and fluidly coupled to a source of a heat transfer (or backside) gas, such as helium gas (He). In operation, the backside gas is provided at controlled pressure into the gas passages to enhance the heat transfer between the electrostatic chuck 166 and the substrate 103.

The substrate support pedestal assembly 148 is configured as a cathode and includes a clamping electrode 180 that is coupled to a plurality of RF bias power sources 184, 186. The RF bias power sources 184, 186 are coupled between the electrode 180 disposed in the substrate support pedestal assembly 148 and another electrode, such as the showerhead assembly 130 or the lid 104 of the chamber body 102. The RF bias power excites and sustains a plasma discharge formed from the gases disposed in the processing region of the chamber body 102.

The dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the processing chamber 100. Thus, the RF bias power sources 184 provide ion energy necessary for performing a deposition or other plasma enhanced process. The RF bias power sources 184, 186 are configured to produce an RF signal having a frequency of about 50 kHz to about 200 MHz and a power of about 0 W to about 8000 W, such as between about 1 W and about 5000 W. An additional bias power source 189 is coupled to the electrode 180 to control the characteristics of the plasma.

During operation, the substrate 103 is disposed on the substrate support pedestal assembly 148 in the processing chamber 100. A process gas and/or gas mixture is introduced into the chamber body 102 through the showerhead assembly 130 from the gas panel 158. The pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 is any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and can include cache, clock circuits, input/output systems, power supplies, and the like. Bi-directional communications between the controller 150 and the various components of the processing chamber 100 are handled through numerous signal cables.

Figure 2:
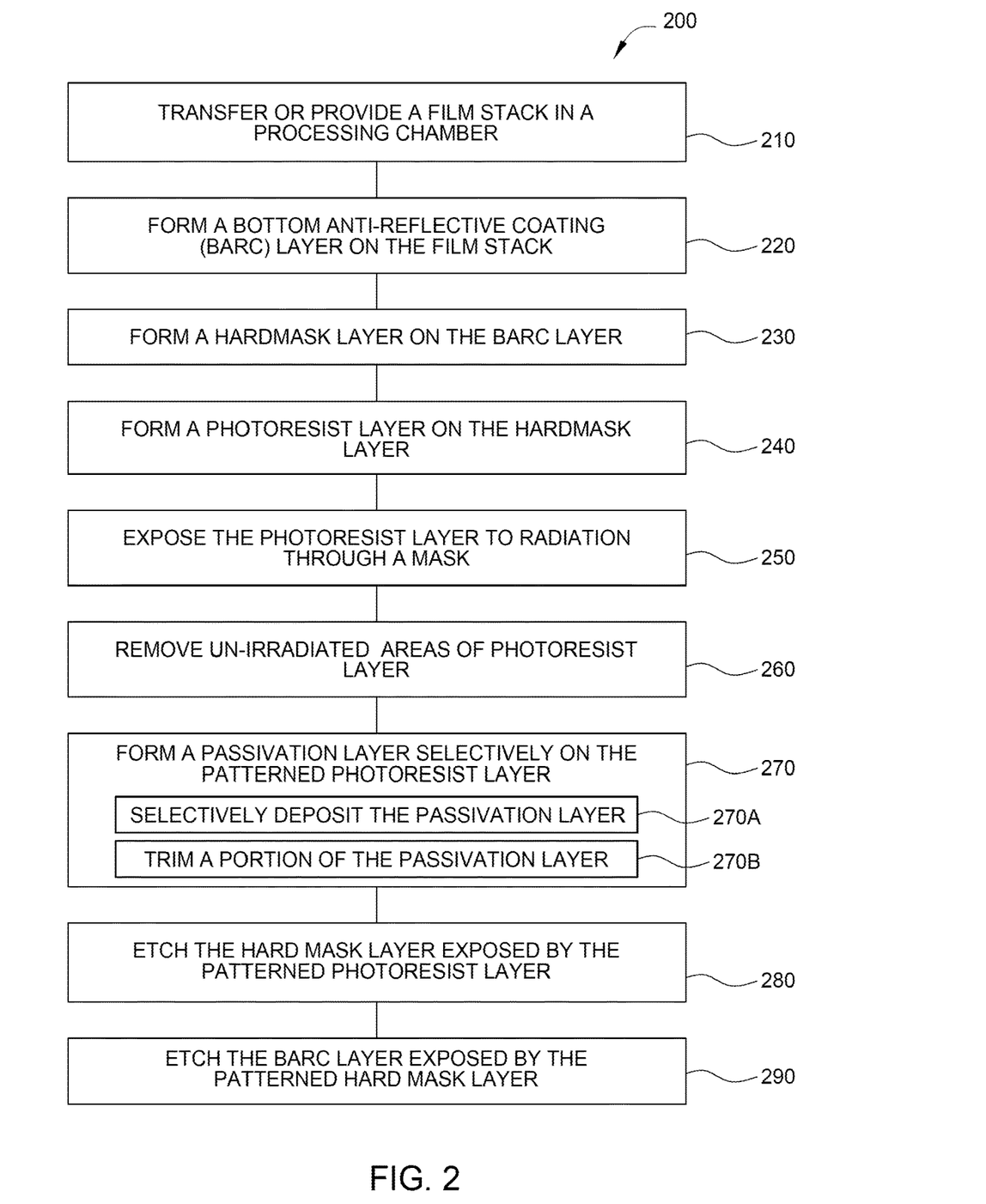
FIG. 2 is a flow diagram for a patterning process, according to one embodiment.

FIG. 2 is a flow diagram of a method 200 for a patterning process, according to one embodiment described herein. FIGS. 3A-3I are cross-sectional views of a structure 300, according to the same embodiment. The method 200 is utilized to form features, such as trenches, vias, openings, and the like, with desired critical dimensions and profiles. Dimensions of such features are between about 14 nm and about 22 nm, for example, about 18 nm. The structure 300 can be utilized in a gate structure, a contact structure, or an interconnection structure in a front end or back end process. Alternatively, the method 200 can be beneficially utilized to etch other types of structures used in the art in semiconductor manufacturing. The method 200 can be stored or accessible to the controller 150 as computer readable media containing instructions, that when executed by the CPU 152 of the controller, causes the processing chamber 100 to perform the method 200.

Those skilled in the art should recognize that a full process for forming a semiconductor device and the associated structures are not illustrated in the drawings or described herein. Although various operations are illustrated in the drawings and described herein, no limitation regarding the order of such operations or the presence or absence of operations is implied. Operations depicted or described as sequential are, unless explicitly specified, merely done so for purposes of explanation without precluding the possibility that the respective operations are actually performed in concurrent or overlapping manner, at least partially if not entirely.

Figure 3A:
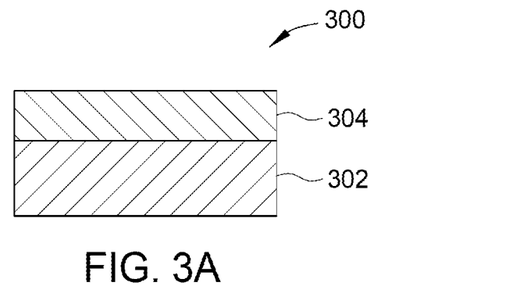
FIGS. 3A-3I illustrate cross-sectional views of a structure, according to one embodiment.

The method 200 begins at operation 210 by transferring or providing a film stack 302, as shown in FIG. 3A, into a processing chamber, such as the processing chamber 100 depicted in FIG. 1. In one embodiment, the film stack 302 has a number of layers vertically stacked on a substrate (not shown). The film stack 302 includes one or more layers of materials used in a semiconductor manufacturing process.

For example, the film stack 302 includes metal-containing dielectric layers and one or more silicon-containing dielectric layers. In some embodiments, the metal-containing dielectric layers are formed of a high-k material having a dielectric constant greater than 4. Suitable examples of the high-k materials include aluminum oxide ($Al_2O_3$), tantalum oxide ($Ta_2O_5$), tantalum nitride (TaN), tantalum oxynitride ($TaN_xO_y$), titanium oxide ($TiO_2$), titanium nitride (TiN), zirconium dioxide ($ZrO_2$), hafnium dioxide ($HfO_2$), hafnium silicon oxide ($HfSiO_4$), lanthanum oxide ($La_2O_3$), yttrium oxide ($Y_2O_3$), strontium titanate ($SrTiO_3$), barium strontium titanate (BST, $BaSrTiO_3$), bismuth doped strontium titanate ($Bi:SrTiO_3$), and lead zirconate titanate (PZT, $Pb[Zr_xTi_{1-x}]O_3$, $0 \le x \le 1$), among others. The silicon-containing dielectric layers can be formed of silicon oxide ($SiO_2$), silicon nitride (SiN), silicon oxynitride (SiON), silicon carbide (SiC), silicon oxycarbide ($SiO_xC_y$, $0 \le x$, $y \le 1$), or the like.

The substrate is any one of semiconductor substrates, silicon wafers, glass substrates and the like. The substrate can be formed of a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate has various dimensions, such as about 200 mm, about 300 mm, about 450 mm, or other diameter, as well as being a rectangular or square panel.

At operation 220, a bottom anti-reflective coating (BARC) layer 304 is formed on the film stack 302, as shown in FIG. 3A. In some embodiments, the BARC layer 304 is made of a carbon-containing material, such as boron doped amorphous carbon. The BARC layer 304 can be a Saphira™ Advanced Patterning Film (APF) carbon hardmask produced by Applied Materials, Inc., located in Santa Clara, Calif. In some embodiments, the BARC layer 304 is a high-density carbon-containing layer and has superior film qualities, such as improved hardness and density. Such hardness and density allow the BARC layer 304 to act as a stronger barrier against metal infiltration and to prevent and reduce nanofailures to a greater extent than conventional spin-on carbon (SOC) hard masks.

The BARC layer 304 can be formed by a physical vapor deposition (PVD) process, a plasma enhanced chemical vapor deposition (PECVD) process, or other suitable deposition processes. In one embodiment, the BARC layer 304 is a diamond-like carbon layer formed by chemical vapor deposition (CVD) (plasma enhanced and/or thermal) processes using hydrocarbon-containing gas mixtures including precursors such as $C_2H_2$, $C_3H_6$, $CH_4$, $C_4H_8$, 1,3-dimethyl-adamantane, bicyclo[2.2.1]hepta-2,5-diene (2,5-Norbornadiene), adamantine ($C_{10}H_{16}$), norbornene ($C_7H_{10}$), or combinations thereof. The deposition process is carried out at temperatures ranging from about −50° C. to about 600° C. The deposition process is carried out at pressures ranging from about 0.1 mTorr to about 10 Torr in the interior volume 106 of the processing chamber 100. The hydrocarbon-containing gas mixture can further include a carrier gas such as He, Ar, Xe, $N_2$, $H_2$, or combinations thereof, and etchant gases such as $Cl_2$, $CF_4$, $NF_3$, or combinations thereof, to improve film quality. The plasma (e.g., capacitive-coupled plasma) can be formed from either top and bottom electrodes or side electrodes of the processing chamber 100. The electrodes can be formed from a single powered electrode, dual powered electrodes, or more electrodes with multiple frequencies such as, but not limited to, 350 KHz, 2 MHz, 13.56 MHz, 27 MHz, 40 MHz, 60 MHz, and 100 MHz, being used alternatively or simultaneously in a CVD system.

Figure 3B:
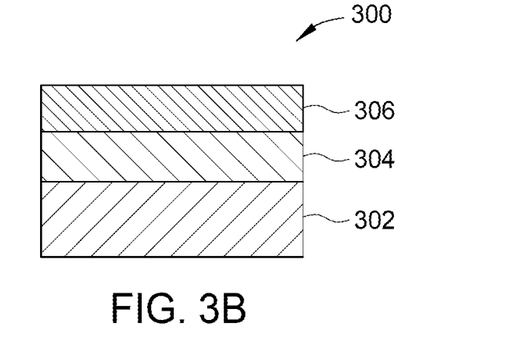

At operation 230, a hardmask layer 306 is formed on the BARC layer 304, as shown in FIG. 3B. The hardmask layer 306 is any conventional hardmask used in the art for photolithography. The hardmask layer 306 can be a metal oxide layer. In one example, material selected for the hardmask layer 306 affects reflection and/or absorption efficiency of extreme ultraviolet (EUV) radiation having a wavelength of between about 5 nm and about 20 nm, for example, about 13.5 nm, during lithography exposure process. Thus, by proper selection of material for the hardmask layer 306, performance of an EUV lithography exposure process, such as high lithography resolution, defect reduction, photoresist layer profile control, energy dose reduction, and/or line edge roughness reduction, is enhanced. For example, material having a higher metal concentration provides a higher absorption coefficient of EUV radiation, and thus the hardmask layer 306 is formed of a metal-containing material, such as a metal dielectric layer, containing one or more metal elements having an atomic number greater than 28, such as 29-32, 37-51, and 55-83. Suitable metal elements include tin (Sn), tantalum (Ta), indium (In), gallium (Ga), zinc (Zn), zirconium (Zr), aluminum (Al), or combinations thereof.

Furthermore, low concentration of silicon dopants and/or oxygen elements in the metal-containing material may further increase free carriers, enhancing absorption coefficient of EUV radiation and reducing likelihood of defect generation. Suitable examples of the metal-containing materials for the hardmask layer 306 include tin oxide (SnO), tin silicon oxide (SnSiO), tantalum oxide (TaO), indium tin oxide (InSnO), indium gallium zinc oxide (IGZO), one or more alloys thereof, one or more dopants thereof, or any combination thereof having a ratio of metal elements to silicon or oxygen elements (metal:Si/O) between about 80:1/19 and about 90:1/9. The metal-containing material for the hardmask layer 306 can have an EUV absorption cross section greater than about $1 \times 10^5$ cm$^2$/mol under an EUV radiation having a wavelength ranging between about 5 nm and about 20 nm. The hardmask layer 306 has a thickness between about 10 Å and about 500 Å, such as between about 20 Å and about 200 Å, for example, between about 50 Å and about 100 Å.

In some embodiments, the hardmask layer 306 includes multiple layers. In these embodiments, the hardmask layer 306 has multiple layers that are formed from different metal-containing materials. Selection of the metal-containing materials for the multiple layers is based on different absorption coefficients of the metal-containing materials. For example, multiple layers having high to low, low to high, or alternating high and low absorption coefficients are sequentially formed so as to enhance reflection of the EUV radiation during the lithography exposure process. In one or more examples, the metal elements selected for one of multiple layers have atomic numbers greater than 28, such as greater than 35, and another may have atomic numbers less than 28.

In some embodiments, the hardmask layer 306 includes a bilayer structure, having a first portion (e.g., an upper portion or layer) containing a metal element having an atomic number greater than 28, such as 29-32, 37-51, and 55-83, and a second portion (e.g., a lower portion or layer) containing an element having an atomic number of less than 28, such as 3-8, 11-16, and 19-27.

In some embodiments, the hardmask is formed as a gradient having different ratio of the metal elements to the silicon and/or oxygen elements in the hardmask layer 306 to provide different absorption coefficients along the bulk film body of the hardmask layer 306. For example, the metal element concentration of the hardmask layer 306 is gradually increased or decreased with the thickness increase of the hardmask layer 306. Alternatively, each layer of the bilayer structure or the multiple layers of the hardmask layer 306 is a gradient layer. For example, in the bilayer structure of the hardmask layer 306, the upper portion of the hardmask layer 306 has a low resistivity with relatively high metal element concentration or even pure metal layer (e.g., such as a metallic Sn layer), while the lower portion of the hardmask layer 306 has a high concentration of silicon and/or oxygen.

The hardmask layer 306 is formed by any conventional process used in the art to form hardmasks. For example, the hardmask layer 306 is formed using a CVD process, a PVD process, an atomic layer deposition (ALD) process, a spin-on-coating process, a spray coating process, or other suitable deposition processes. In some embodiments, during a plasma enhanced CVD or PVD process of forming the hardmask layer 306, a carrier gas and/or an inert gas with relatively higher atomic weight, such as Xe or Kr, is flowed. The temperature of the process region during the formation of the hardmask layer 306 is between about −50° C. to about 250° C. It is believed that a relatively low temperature of the process region (e.g., less than about 250° C.), while forming the hardmask layer 306, may assist forming the hardmask layer 306 at a relatively slow deposition rate, rendering a film surface with a relatively smooth surface.

Figure 3C:
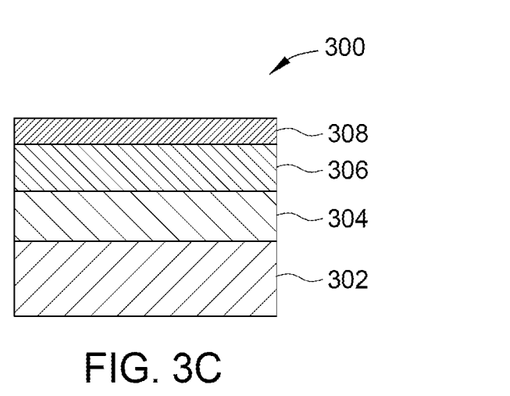

At operation 240, a photoresist layer 308 is formed on the hardmask layer 306, as shown in FIG. 3C. In the embodiments described herein, the photoresist layer 308 is formed of an organometallic material including organic ligands. For example, the organometallic material is formed of a polymeric metal oxo/hydroxo network in which the metals are bonded with the oxo ligands ($O^{2-}$) and hydroxo ligands ($OH^-$), and also with organic ligands, or a polynuclear metal oxo/hydroxo species with organic ligands.

The photoresist layer 308 is formed by any conventional method used in the art to create a photoresist. For example, the photoresist layer 308 is formed by a CVD process, a PVD process, an ALD process, a spin-on-coating process, a spray coating process, or other suitable deposition processes, using a precursor solution that includes metal oxo-hydroxo cations with organic ligands in an organic solvent. Metal (M) oxo-hydroxo cations herein refer to one or more M ions that are bonded to oxygen atoms (O) to form oxo ligands ($O^{2-}$) and/or hydroxo ligands ($OH^-$) with release of hydrogen ions ($H^-$) in an aqueous solutions. M oxo-hydroxo cations are further bonded to the organic ligands to form one or more metal carbon (M-C) ligand bonds and/or metal carboxylate (M-$O_2$C) ligand bonds. Suitable M for formation of metal oxo/hydroxo cations include group 13, 14, and 15 metals, such as tin (Sn), antimony (Sb), and indium (In). Additional metals, for example, Ti, Zr, Hf, V, Co, Mo, W, Al, Ga, Si, Ge, P, As, Y, La, Ce, Lu, or combinations thereof, can be blended in the precursor solution to produce more complex polynuclear metal oxo/hydroxo cations (i.e., including two or more metal atoms). The additional metals can be alternatives to or in addition to tin (Sn), antimony (Sb), and/or indium (In). If blends of metal ions are used, the mole ratio of non-tin/antimony/indium ion per tin/antimony/indium metal ion is up to about 1 in one example, and between about 0.1 and about 0.75 in other examples. In some embodiments, tin (Sn) or indium (In) is used in the precursor solution to form a photoresist layer having strong absorption of EUV at about 13.5 nm wavelength, and in combination with organic ligands, good absorption of ultraviolet (UV) radiation at about a 193 nm wavelength. In some embodiments, Hf is used to provide good absorption of the electron beam material and the EUV radiation. In some embodiments, one or more metal compositions including Ti, V, Mo, W, or combinations thereof are added to move an absorption edge to longer wavelengths to provide sensitivity to UV radiation at about a 248 nm wavelength.

The organic ligands can include alkyls (e.g., methyl, ethyl, propyl, butyl, t-butyl, aryl (phenyl, benzyl)), alkenyls (e.g., vinyl, allyl), and carboxylates (e.g., acetate, propanoate, butanoate benzoate). A ratio of concentration of the organic ligands to concentration of the metal oxo-hydroxo cations in the precursor solution is between about 0.25 and about 4 in one example, and between about 0.5 and about 3.5 in another example, between about 0.75 and about 3 in another example, and between about 1 and about 2.75 in other examples. A person of ordinary skill in the art will recognize that additional ranges of organic ligand concentrations within the explicit ranges above are contemplated and are within the present disclosure.

The organic solvent can include alcohols, esters, or combinations thereof. In some embodiments, the organic solvent includes aromatic compounds (e.g., xylenes, toluene), esters (propylene glycol monomethyl ether acetate, ethyl acetate, ethyl lactate), alcohols (e.g., 4-methyl-2-pentanol, 1-butanol, anisole), ketones (e.g., methyl ethyl ketone), and the like.

In some embodiments, the deposited photoresist layer 308 has a thickness of between about 1 nm and about 1 μm, for example, between about 8 nm and about 13 nm.

Figure 3D:
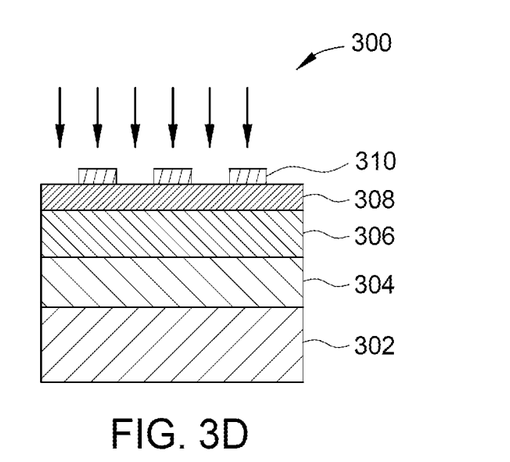

At operation 250, the photoresist layer 308 is exposed to radiation according to a selected pattern including features, such as trenches, vias, openings, and the like, with desired critical dimensions and profiles to be formed in the film stack 302, as shown in FIG. 3D. The selected pattern is transferred to a corresponding pattern or latent image in the photoresist layer 308 with irradiated areas and un-irradiated areas. When exposed to radiation, the photoresist layer 308 absorbs radiation that results in energy that breaks the bonds between the metal and the organic ligands (i.e., M-C ligand bonds and/or M-02C ligand bonds) within the irradiated areas of the photoresist layer 308. This breakage of the bonds may lead to a composition change in the irradiated areas of the photoresist layer 308 through formation of M-OH ligand bonds or through condensation to form M-O-M ligand bonds.

With the absorption of a sufficient amount of radiation, there is a contrast of material properties between the irradiated areas of the photoresist layer 308 without or substantially without the organic ligands and the un-irradiated areas of the photoresist layer 308 with the organic ligands intact. For example, the un-irradiated areas of the photoresist layer 308 having the organic ligands are relatively hydrophobic, and the irradiated areas of the photoresist layer 308 not having the organic ligands are less hydrophobic (i.e., more hydrophilic) than the un-irradiated areas of the photoresist layer 308. Using this contrast, the photoresist layer 308 provides positive tone patterning (in which the irradiated areas become soluble to a developer agent) and negative tone patterning (in which the irradiated areas become insoluble to a developer agent) with suitable developer agents.

The radiation includes electromagnetic radiation, an electron beam, or other suitable radiation. Radiation is directed to the photoresist layer 308 through a mask 310. In another embodiment, a radiation beam is controllably scanned across the photoresist layer 308. The electromagnetic radiation has any desired wavelength or range of wavelengths, such as visible radiation, UV radiation (between about 100 nm and about 400 nm, including EUV radiation between about 10 nm and about 121 nm, and far ultraviolet (FUV) radiation between about 122 nm and about 200 nm), or x-ray radiation (including soft x-rays between about 0.1 nm and about 10 nm), depending on a desired spatial resolution of patterning the underlying film stack 302. A higher resolution pattern is achieved with shorter wavelength radiation, such as UV radiation, x-ray radiation, or an electron beam. For example, EUV radiation generated from a Xe or Sn plasma source excited using high energy lasers or discharge pulses is used for lithography at about 13.5 nm. In some embodiments, the contrast is enhanced by a post-irradiation heat treatment.

Figure 3E:
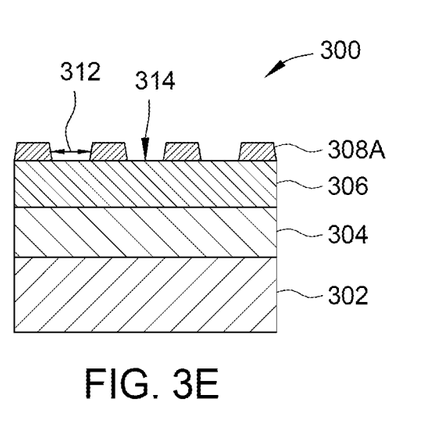

At operation 260, the photoresist layer 308 is developed to pattern the photoresist layer 308 according to the selected pattern, as shown in FIG. 3E. The patterned photoresist layer 308A defines openings 312 that expose a surface 314 of the underlying hardmask layer 306 for etching.

A developer agent for developing the irradiated photoresist layer 308 and removing the un-irradiated areas of the photoresist layer 308 (i.e., negative tone patterning) to form a patterned photoresist layer 308A can include an organic solvent, such as the solvents used in the precursor solutions. In some embodiments, suitable developer agents include aromatic compounds (e.g., benzene, xylenes, toluene), esters (e.g., propylene glycol monomethyl ester acetate, ethyl acetate, ethyl lactate, n-butyl acetate, butyrolactone), alcohols (e.g., 4-methyl-2-pentanol, 1-butanol, isopropanol, anisole), ketones (e.g., methyl ethyl ketone, acetone, cyclohexanone), ethers (e.g., tetrahydrofuran, dioxane) and the like. The development is performed for about 5 seconds to about 30 minutes in one example, such as about 8 seconds to about 15 minutes, or about 10 seconds to about 10 minutes.

In some embodiments, the developer agent includes additional compositions to facilitate the development process, for example, improving the contrast, sensitivity and LWR, and inhibiting formation and precipitation of metal oxide particles. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, ethylenediamine-tetraacetic acid (EDTA), tungstate, molybdate, or the like, and combinations thereof. Other potentially useful additives include, for example, molecular chelating agents, such as polyamines, alcohol amines, amino acids, or combinations thereof. If the optional additives are present, the developer agents include no more than about 10 weight percent additive in one example, and no more than about 5 weight percent additive in another example. A person of ordinary skill in the art will recognize that additional ranges of additive concentrations within the explicit ranges above are contemplated and are within the present disclosure.

The developer agent is applied to the irradiated photoresist layer 308 using any conventional method used in the art. For example, the development agent is applied using a spin-on-coating process, a spray coating process, or other suitable coating processes. In some embodiments, spin rinsing and/or drying are performed to complete the development process. Suitable rinsing solutions include ultrapure water, methyl alcohol, ethyl alcohol, propyl alcohol, and combinations thereof.

In some embodiments, the patterned photoresist layer 308A is treated to further condense the material and to further dehydrate the material. In some embodiments, the patterned photoresist layer 308A is heated to a temperature of between about 100° C. and about 600° C., such as between about 175° C. and about 500° C., or such as between about 200° C. and about 400° C. The heating is performed for at least about 1 minute, such as for about 2 minutes to about 1 hour, or such as between about 2.5 minutes and about 25 minutes. The heating can be performed in air, vacuum, or an inert gas ambient environment. The inert gas ambient environment can include argon gas (Ar) and/or nitrogen gas ($N_2$). A person of ordinary skill in the art will recognize that additional ranges of temperatures and time for the heat treatment within the explicit ranges above are contemplated and are within the present disclosure.

In some embodiments, adjacent linear segments of neighboring structures can have an average pitch of less than about 60 nm, such as less than about 50 nm, or such as less than about 40 nm.

Figure 3F:
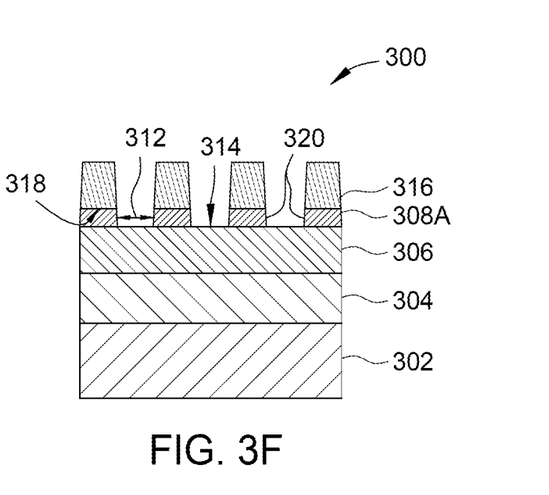

At operation 270, a passivation layer 316 is formed selectively on the patterned photoresist layer 308A prior to etching of the hardmask layer 306, as shown in FIG. 3F. The passivation layer 316 is formed of carbon-containing material. The passivation layer 316 can be formed by supplying a deposition gas mixture on the patterned photoresist layer 308A in a PVD chamber, or in-situ in an etching chamber. In the embodiments described herein, the passivation layer 316 is predominantly formed on a top surface 318 of the patterned photoresist layer 308A, rather than sidewalls 320 of the patterned photoresist layer 308A or the exposed surface 314 of the hardmask layer 306. Thus, profile (e.g., dimensions and geometries) of the openings 312 defined by the patterned photoresist layer 308A are maintained unchanged so as to facilitate transfer of the openings 312 to the hardmask layer 306 without profile alternation.

While not intending to be bound by theory, it is believed that carbon atoms are bonded to the top surface 318 (i.e., the irradiated areas) of the photoresist layer 308 having the M-OH ligand bonds and M-O-M ligand bonds due to the breakage of the bonds between the metal and the organic ligands (i.e., M-C ligand bonds and/or M-$O_2$C ligand bonds). The sidewalls 320 of the patterned photoresist layer 308A maintain the composition of the un-irradiated photoresist layer 308 having the organic ligands intact, and thus do not contain the M-OH ligand bonds and M-O-M ligand bonds to which carbon atoms can be bonded. The exposed surface 314 of the hardmask layer 306 also does not contain the M-OH ligand bonds and M-O-M ligand bonds, and thus carbon atoms are not bonded to the exposed surface 314 of the hardmask layer 306.

In some embodiments, the deposition gas mixture includes a carbon-containing gas, such as carbon monoxide (CO) or methane ($CH_4$). The deposition gas mixture can be deposited while applying a source power of about 400 W to about 600 W, such as about 500 W. Operation 270 can be performed for a period of about 1 s to about 20 s, such as about 7 s. The chamber pressure can be maintained from about 1 mTorr to about 20 mTorr, such as about 10 mTorr.

As described above, the hardmask layer 306 is formed of a material containing metal elements, such as tin (Sn), and the photoresist layer 308 is also formed of a material containing metal elements, such as tin (Sn), leading to poor etch selectivity between the hardmask layer 306 and the photoresist layer 308. Thus, if the hardmask layer 306 having the photoresist layer 308 disposed thereon is etched, control of profile of openings etched in the hardmask layer 306 can be inaccurate, eventually leading to device failure. Having the passivation layer 316 disposed thereon, the patterned photoresist layer 308B has higher etching selectivity than the hardmask layer 306, leading to higher accuracy control of profile of openings etched in the hardmask layer 306.

Figure 4A:
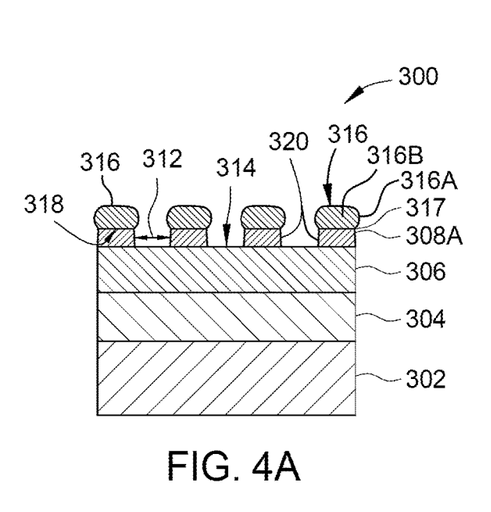
FIGS. 4A-4B illustrate cross-sectional views of a structure, according to one embodiment.

In one embodiment, operation 270 includes two suboperations 270A, 270B. At suboperation 270A, passivation material 317 is selectively deposited on the top surface 318, as shown in FIG. 4A. As shown, the passivation material 317 includes undesired portions 316A and desired portions 316B. The desired portions 316B are desired to remain over the top surface 318 after the completion of operation 270. The undesired portions 316A are desired to be removed after the completion of operation 270. For example, the desired portions 316B are formed in the desired shape of the passivation layer 316, such as a rectangle, whereas the undesired portions 316A bulge out such that the passivation material 317 has a circular or other non-rectangular shape. However, the disclosure is not so self-limiting, and any undesired portions 316A that cause the passivation material 317 to have an undesired shape can be covered by the disclosure herein. Suboperation 270A can be performed as described in the discussion of operation 270 above.

Figure 4B:
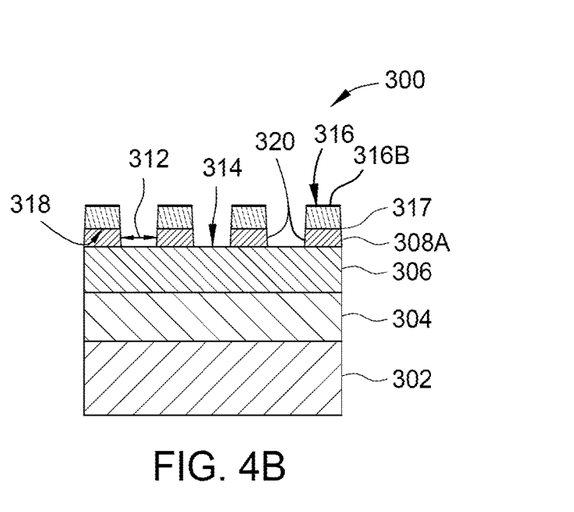

At suboperation 270B, the undesired portions 316A are removed, as shown in FIG. 4B. The undesired portions 316A are removed such that the desired portions 316B remain. The undesired portions 316A are removed using an etching procedure. In one example, the undesired portions are removed using a reactive ion-etch (RIE). In another example, the undesired portions 316A are removed using a radical etch that preferentially attacks the large surface portion of the undesired portions 316A. For example, the relatively large surface area of the undesired portions 316A increases the etch rate of the undesired portions in comparison to the desired portions 316B having a relatively small surface area.

In some embodiments, the radical etch includes an etch gas. The etch gas includes $CF_4$, $CHF_3$, $C_4F_8$, $C_xF_yH_z$ (where x, y, and z are any integer), $H_2$, $N_2$, $O_2$, and any combination thereof, for example, $CH_4$ and $N_2$, or $H_2$ and $O_2$, or $CH_4$ and $H_2$. It has been advantageously discovered that the etch gas including a fluorine-containing gas etches more rapidly in the lateral direction (i.e., the direction parallel to the top surface 318) than hydrogen-containing gases. In some embodiments, the radical etch includes a flow ratio of about 1:1 to about 1:10 of $CF_4$ to about $N_2$, such as a ratio of about 1:6. The radical etch includes applying a source power of about 500 W to about 1500 W, such as about 1000 W, to the etch gas. Operation 270 can be performed for a period of about 1 s to about 20 s, such as about 7 s. The chamber pressure can be maintained from about 1 mTorr to about 30 mTorr, such as about 20 mTorr.

Suboperations 270A, 270B can be repeated any number of times until the passivation layer 316 is of the desired shape and dimensions (e.g., height of the passivation layer 316). For example, suboperations 270A, 270B can be repeated five times. The LWR can be reduced to less than about 2.5 nm, such as lass than about 1.5 nm. The number of suboperations 270A, 270B cycles can be tuned to the desired height and LWR of the passivation layer 316.

Figure 3G:
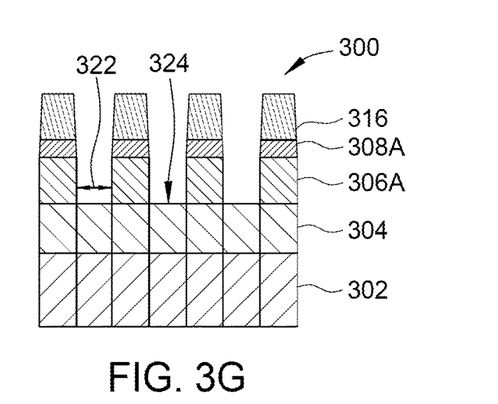

At operation 280, the hardmask layer 306 is etched to transfer the openings 312 of the patterned photoresist layer 308A to the hardmask layer 306, as shown in FIG. 3G. The patterned hard mask layer 306A defines openings 322 that exposes a surface 324 of the underlying BARC layer 304 for etching. In one or more examples, the etching process at operation 280 is performed by supplying an etching gas mixture into the processing chamber 100 while maintaining a temperature of the substrate support pedestal assembly 148 between room temperature (e.g., about 23° C.) and about 150° C.

In some examples, the etching gas mixture includes at least one halogen-containing gas. The halogen-containing gas can include a fluorine-containing gas, a chlorine-containing gas, or a bromide-containing gas. Suitable examples of the halogen-containing gas include $SF_6$, $SiCl_4$, $Si_2Cl_6$, $NF_3$, $HBr$, $Br_2$, $CHF_3$, $CH_2F_2$, $CF_4$, $C_2F$, $C_4F_6$, $C_3F_8$, $HCl$, $C_4F_8$, $Cl_2$, $HF$, $CCl_4$, $CHCl_3$, $CH_2Cl_2$, and $CH_3Cl$. In some examples, silicon-containing gas may also be supplied in the etching gas mixture. Suitable examples of the silicon-containing gas include $SiCl_4$, $Si_2Cl_6$, $SiH_4$, $Si_2H_6$, and the like. Examples of the chlorine-containing gas include $HCl$, $C_{12}$, $CCl_4$, $CHCl_3$, $CH_2Cl_2$, $CH_3Cl$, $SiCl_4$, $Si_2Cl_6$, and the like, and examples of the bromide-containing gas include $HBr$, $Br_2$, and the like. A reacting gas, such as an oxygen-containing gas or a nitrogen-containing gas, for example, $O_2$, $N_2$, $N_2O$, $NO_2$, $O_3$, $H_2O$, or the like, can also be supplied in the etching gas mixture as needed. In one example, the etching gas mixture includes $HBr$, $CH_4$, and $Ar$. The flow rate of $HBr/CH_4/Ar$ is from about 1:1:1 to about 2:1:10, such as about 5:4:20.

In one or more examples, the halogen-containing gas used to etch the hardmask layer 306 includes a chlorine-containing gas or a bromide-containing gas. While supplying the etching gas mixture into the processing chamber, an inert gas can be supplied into the etching gas mixture to assist the profile control as needed. Examples of the inert gas supplied in the gas mixture include Ar, He, Ne, Kr, Xe, or the like. In one particular example, the etching gas mixture utilized to etch the hardmask layer 306, such as a metal-containing material (e.g., a Sn/SnO/SnSiO layer), includes $HBr$, $Cl_2$, $Ar$, $He$, or combinations thereof.

During etching, the chamber pressure of the etching gas mixture is also regulated. The process pressure in the plasma processing chamber is regulated between about 2 mTorr to about 100 mTorr, such as about 3 mTorr to about 20 Torr, such as about 6 mTorr. An RF bias power can be applied to maintain a plasma formed from a continuous mode or a pulsed mode as needed in presence of the etching gas mixture. For example, an RF power source with a frequency of about 13.56 MHz is applied at an energy level of between about 200 W to about 1000 W, such as about 500 W, to an inductively coupled antenna source to maintain a plasma inside the etch chamber. In addition, an RF bias power is applied less than about 500 W, such as between about 0 W to about 450 W, such as about 150 W. The RF bias power is applied with a frequency of between about 2 MHz and about 13.56 MHz.

In one example, the RF bias power and the RF power source are pulsed in the processing chamber 100 during the etching at operation 280. The pulsing of the RF bias power and the RF power source can be synchronized or non-synchronized with each other. For example, the RF power source is pulsed to the processing chamber prior to pulsing the RF bias power. For example, the RF bias power is in pulse mode synchronized with the RF power source or with a time delay with respect to the RF power source. In one or more examples, the RF power source and the RF bias power are pulsed between about 5% and about 75% of each duty cycle. Each duty cycle between each time unit is between about 0.1 ms and about 10 ms.

In one example of the etching gas mixture supplied at operation 280, the $O_2$ gas is supplied into the chamber at a rate between about 0 sccm to about 50 sccm. The halogen-containing gas, such as HBr, can be supplied at a flow rate between about 25 sccm and about 250 sccm, such as about 100 sccm.

Figure 3H:
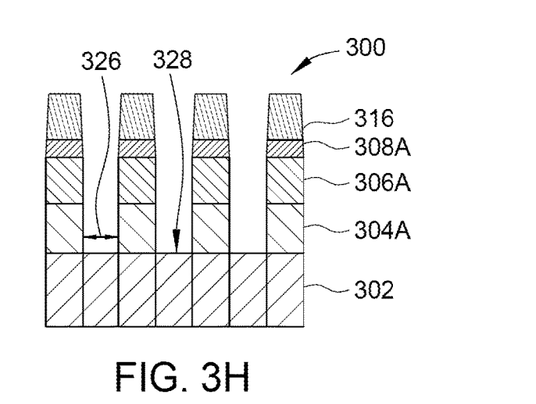

At operation 290, the BARC layer 304 is etched to transfer the openings 322 in the patterned hardmask 306A to the BARC layer 304, as shown in FIG. 3H. The patterned BARC layer 304A defines openings 326 that exposes a surface 328 of the underlying film stack 302. The etching gas mixture utilized to etch the BARC layer 304 at operation 290 can be the same as the etching gas mixture utilized to etch the hardmask layer 306 at operation 280. Alternatively, the etching gas mixture utilized to etch the BARC layer 304 at operation 290 is different from the etching gas mixture utilized to etch the hardmask layer 306 at operation 280. In one or more examples, the etching gas mixture utilized to etch the BARC layer 304 at operation 290 includes a chlorine-containing gas, such as HCl or $Cl_2$ gas. In one example, the etching gas mixture includes $O_2$, $CH_4$, and $N_2$. The flow rate of $O_2/CH_4/N_2$ is from about 1:1:1 to about 1:1:10, such as about 1:1:7.

Figure 3I:
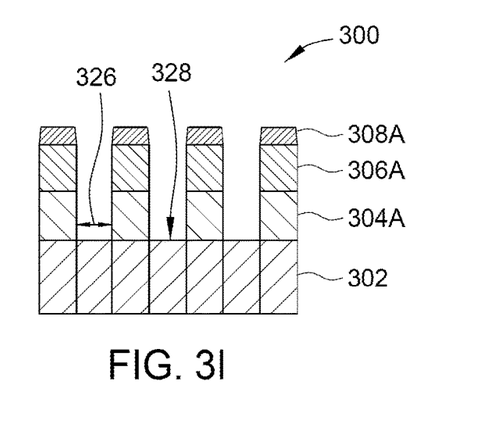

After the openings 326 are formed in the BARC layer 304, a de-scum or a strip process can performed to remove the remaining passivation layer 316, if any, as shown in FIG. 3I. It is noted that further etching process or patterning process can be performed to continue transferring the openings 326 into the film stack 302 and form the selected pattern including features, such as trenches, vias, openings, and the like, with desired critical dimensions and profiles within the film stack 302.

In the embodiments described herein, methods are provided for forming a metal-containing photoresist layer having a carbon-containing passivation layer selectively disposed thereon that has a high etch selectivity from an underlying metal-containing hardmask layer, leading to higher accuracy control of profile of openings etched in the hardmask layer. Thus, lithographic exposure accuracy, such as high resolution, low energy dose, good photoresist profile control and low line edge roughness may be enhanced.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for etching a hardmask layer, comprising:
    forming a photoresist layer comprising an organometallic material on an unpatterned hardmask layer, the organometallic material comprising a metal bonded to an organic ligand;
    exposing the photoresist layer to ultraviolet radiation through a mask having a selected pattern, the radiation breaking a bond between the metal and the organic ligand to form an irradiated top surface co-planar with an un-irradiated top surface;
    removing un-irradiated areas defined by the un-irradiated top surface of the photoresist layer to form a patterned photoresist layer having openings exposing surfaces of the unpatterned hardmask layer, the exposed surfaces coplanar with surfaces of the unpatterned hardmask layer covered by the patterned photoresist, the patterned photoresist layer comprising:
        the irradiated top surface, comprising ligand bonds formed from the radiation; and
        a sidewall comprising the metal bonded to the organic ligand;
    forming a passivation layer comprising a carbon-containing material selectively on the irradiated top surface of the patterned photoresist layer, the passivation layer formed by bonding the carbon-containing material to the ligand bonds in the irradiated top surface, the passivation layer spaced above the hardmask layer by the sidewall of the patterned photoresist layer, wherein the forming the passivation layer includes one or more cycles, wherein each cycle of the one or more cycles comprises:
        selectively depositing passivation material on the irradiated top surface; and
        laterally trimming undesired portions of the passivation material; then
    etching the exposed surfaces of the unpatterned hardmask layer through the openings until a layer underlying the unpatterned hardmask layer is exposed through the openings.

2. The method of claim 1, wherein the organometallic material comprises tin (Sn).

3. The method of claim 1, wherein the trimming the undesired portions comprises exposing the passivation material to a radical etch and disposing the passivation material inward of the sidewall.

4. The method of claim 1, wherein the forming of the passivation layer further comprises:
    supplying deposition gas comprising CO gas onto the patterned photoresist layer; and
    the undesired portions extend past the sidewall and over the exposed surfaces of the unpatterned hardmask layer.

5. The method of claim 1, wherein the hardmask layer is disposed between the photoresist layer and an anti-reflective coating layer, the anti-reflective coating layer comprising carbon.

6. The method of claim 1, wherein, after forming the passivation layer, etching the exposed surfaces through the unpatterned hardmask layer forms a patterned hardmask layer, the patterned hardmask layer comprising openings formed from the exposed surfaces.

7. The method of claim 4, wherein the undesired portions of the passivation layer are disposed away from and separated from the unpatterned hardmask layer by the sidewall of the patterned photoresist layer.

8. The method of claim 1, wherein the undesired portions of the passivation material bulge outward from desired portions of the passivation layer.

9. The method of claim 1, wherein trimming forms the passivation layer from extending outward past the sidewall and over the exposed surfaces of the unpatterned hardmask layer to inward of the sidewall and only over the irradiated top surface of the patterned photoresist layer.

10. A method for etching a film stack, comprising:
    forming a hardmask layer, the hardmask layer being an unpatterned hardmask layer;

forming a photoresist layer comprising an organometallic material on the hardmask layer, the organometallic material comprising a metal bonded to an organic ligand;

exposing the photoresist layer to ultraviolet radiation through a mask having a selected pattern, the radiation breaking a bond between the metal and the organic ligand to form an irradiated top surface co-planar with an un-irradiated top surface;

removing un-irradiated areas defined by the un-irradiated top surface of the photoresist layer to form a patterned photoresist layer, the patterned photoresist layer comprising:

openings through the patterned photoresist layer, the openings exposing surfaces of the hardmask layer, the exposed surfaces coplanar with surfaces of the unpatterned hardmask layer covered by the patterned photoresist layer;

the irradiated top surface, comprising ligand bonds formed from the radiation; and a sidewall;

forming a passivation layer comprising a carbon-containing material selectively on the irradiated top surface of the patterned photoresist layer, the carbon-containing material formed by supplying deposition gas comprising CO gas to the patterned photoresist layer and bonding carbon of the deposition gas to the ligand bonds in the irradiated top surface, the passivation layer spaced above the hardmask layer by the sidewall of the patterned photoresist layer, wherein the forming the passivation layer includes one or more cycles, wherein each cycle of the one or more cycles comprises:

selectively depositing passivation material only on the irradiated top surface; and trimming undesired portions of the passivation material, the undesired portions disposed above a plane defined by the irradiated top surface and over the exposed surfaces of the hardmask layer; then etching the exposed surfaces of the hardmask layer through the openings until a film stack underlying the hardmask layer is exposed through the openings to form a patterned hardmask layer; and etching the film stack exposed through the openings of the patterned hardmask layer.

11. The method of claim 10, wherein the organometallic material comprises tin (Sn).

12. The method of claim 10, wherein the organic ligands are selected from the group consisting of alkyls, alkenyls, and carboxylates.

13. The method of claim 10, wherein the hardmask layer comprises tin (Sn).

14. The method of claim 13, wherein a metal-containing material of the hardmask layer is selected from the group consisting of tin oxide (SnO), tin silicon oxide (SnSiO), tantalum oxide (TaO), indium tin oxide (InSnO), indium gallium zinc oxide (IGZO), and any combination thereof.

15. The method of claim 10, wherein the trimming the undesired portions comprises exposing the passivation material to a radical etch before etching the unpatterned hardmask layer.

16. The method of claim 10, wherein the hardmask layer is disposed between the photoresist layer and an anti-reflective coating layer, the anti-reflective coating layer comprising carbon.

17. The method of claim 10, wherein the undesired portions of the passivation layer are disposed outward of the sidewall of the patterned photoresist layer and bulge out from desired portions of the passivation layer, and the desired portions of the passivation layer are disposed inward of the sidewall of the of the patterned photoresist layer.

18. A method for forming a passivation layer, comprising:

selectively depositing passivation material on an irradiated top surface of a patterned photoresist layer, the patterned photoresist having openings that define exposed surfaces coplanar with surfaces of an unpatterned hardmask layer covered by the patterned photoresist, the irradiated top surface comprising M-OH ligand bonds and M-O-M ligand bonds, the passivation material formed by repeating a cycle comprising:

supplying a deposition gas comprising carbon to the irradiated top surface to bond the carbon with the M-OH ligand bonds and M-O-M ligand bonds, the irradiated top surface forming a plane, the patterned photoresist layer comprising organometallic material, and the patterned photoresist layer disposed between the passivation material and a hardmask layer; and laterally trimming undesired portions of the passivation material disposed above the plane of the top surface and extending past sidewalls of the patterned photoresist over the exposed surfaces of an unpatterned hardmask layer, wherein the passivation layer comprises a carbon-containing material that bonds with the M-OH ligand bonds and M-O-M ligand bonds of the irradiated top surface of the patterned photoresist layer while selectively depositing the passivation material; then etching the exposed surfaces of the hardmask layer through the openings until a layer underlying the hardmask layer is exposed through the openings, the etching forming a patterned hardmask layer having openings therethrough after forming the passivation layer.

19. The method of claim 18, wherein the selectively depositing the passivation material and the trimming the undesired portions of the passivation material are each repeated one or more times before etching the hardmask layer, and the openings through the hardmask layer formed after forming the passivation layer.

20. The method of claim 19, wherein the selectively depositing the passivation material and the trimming the undesired portions of the passivation material are each repeated five times and before the hardmask layer is etched.

21. The method of claim 18, wherein the trimming the undesired portions comprises exposing the passivation material to a radical etch to disposed the passivation material inward of the sidewalls of the patterned photoresist.

22. The method of claim 21, wherein the radical etch comprises an etch gas comprising $C_xF_y$, where x and y are integers.

23. The method of claim 21, wherein the radical etch comprises an etch gas comprising $N_2$.

24. The method of claim 18, wherein the hardmask layer is disposed between the photoresist layer and an anti-reflective coating layer, the anti-reflective coating layer comprising carbon.

25. The method of claim 18, wherein selectively depositing passivation material is only on the irradiated top surface of the patterned photoresist layer.

* * * * *